United States Patent [19]
Johnson

[11] Patent Number: 6,071,130
[45] Date of Patent: Jun. 6, 2000

[54] SURFACE MOUNTED CONTACT BLOCK

[75] Inventor: Thomas A. Johnson, Draper, Utah

[73] Assignee: 3COM Corporation, Santa Clara, Calif.

[21] Appl. No.: 09/203,222

[22] Filed: Nov. 30, 1998

[51] Int. Cl.[7] .................................................. H01R 4/66
[52] U.S. Cl. ........................... 439/92; 439/76.1; 439/946
[58] Field of Search .......................... 174/52.2; 257/787;
361/816, 818; 439/95–97, 92, 76.1, 946, 83, 79

[56] References Cited

U.S. PATENT DOCUMENTS

| | | | |
|---|---|---|---|
| 5,011,424 | 4/1991 | Simmons | 439/352 |
| 5,085,601 | 2/1992 | Buchter et al. | 439/660 |
| 5,330,360 | 7/1994 | Marsh et al. | 439/95 |
| 5,452,184 | 9/1995 | Scholder et al. | 439/76.1 |
| 5,537,294 | 7/1996 | Siwinski | 361/753 |
| 5,554,821 | 9/1996 | Patterson et al. | 174/52.2 |
| 5,594,204 | 1/1997 | Taylor et al. | 174/52.2 |
| 5,677,511 | 10/1997 | Taylor et al. | 174/52.2 |
| 5,836,774 | 11/1998 | Tan et al. | 439/76.1 |
| 5,879,170 | 3/1999 | Nogami | 439/76.1 |
| 5,906,496 | 5/1999 | DelPrete et al. | 439/92 |

*Primary Examiner*—Gary F. Paumen
*Attorney, Agent, or Firm*—Workman, Nydegger & Seeley

[57] ABSTRACT

A contact system is disclosed that comprises a metal contact disposed in a dielectric body. The dielectric body is disposed in a printed circuit board depression and the metal contact has at least one folded section that makes electrical contact with the printed circuit board. The inventive contact system is particularly useful for EMI and ESD control in peripheral cards such as PCMCIA cards.

10 Claims, 5 Drawing Sheets

SURFACE MOUNTED CONTACT BLOCK

BACKGROUND OF THE INVENTION

1. The Field of the Invention

The present invention relates to electrical connections. More particularly, the present invention relates to printed circuit boards and electrical grounding thereof. In particular, the present invention relates to a cover-to-cover contact block in an electronic peripheral card for the control and management of electromagnetic interference and electrostatic discharge.

2. The Relevant Technology

The proliferation of personal computers caused a large demand for expansion boards to enhance their functions. With older personal computers, expansion boards were mounted internally and therefore required the computer cover to be removed before installation thereof. The advent of electronic devices such as laptop and notebook personal computers, hand held computers, and other devices such as personal digital assistants (PDAs) necessitated the development of a portable expansion board. Such a portable expansion board has been referred to as a peripheral card or a PCMCIA card. PCMCIA cards are insertable in external slots of laptops, notebooks, sub-notebooks, and other hand held devices such as PDAs. The small size of these electronic devices and their portability facilitates the interchange of functionality by installing and removing different peripheral cards into the external slots of the computer or other electronic device. Typical peripheral cards include modems, wireless communicators, and memory expansion inserts.

Because these peripheral cards may be removed from the electronic device, both their installation and there functioning within the electronic device may trigger electrostatic discharge (ESD) or also electromagnetic interference (EMI). An electrostatic charge may build up on any conductive surface of a peripheral card and as such, ESD may cause damage to both the electronic components within the peripheral card as well as the electronic device into which the peripheral card is inserted. An ESD therefore must be properly dealt with for such peripheral cards. An effective discharge path to a ground source such as a computer chassis is needed from any surface area of the card.

Another requirement is that the peripheral card be adequately shielded against radiating or receiving EMI. The shield must have a sufficiently low ohmic resistivity such that no anticipated electromagnetic energy can penetrate it. The shield therefore must have the function of both adequate thickness and adequate ohmic resistance. Currently, peripheral cards such as PCMCIA cards are constructed with a relatively thin two-sheet, metal shield that can provide adequate shielding at all anticipated frequencies. The shield also needs to provide a conductive surface area in order to allow for a substantially continuous current flow through the shield surface to ground. If a discontinuity arises between the shield and the leads to ground, a slot antenna is created and EMI can penetrate the peripheral card or it can be generated by peripheral card such that it interferes with the larger electronic device.

Several packaging methods have been developed for the construction of peripheral cards that assist to provide ESD and EMI protection. When an insufficient path to ground is the result of the peripheral card construction, many problems may arise during operation of the peripheral card and it may also cause problems during operation of the electronic device with which the peripheral card is connected. To overcome EMI problems, it is therefore preferable to increase the ground-to-signal ratio in a PCB so as to improve the signal flow therethrough to enhance signal transmission performance of the peripheral card. Additionally, where a PCB does not have proper connection to ground, the PCB can suffer from not only EMI interference problems, but also ESD problems which will arise because the live electronic components on the peripheral card may arc to the card's metallic shield.

Several arrangement have been made in the art to provide adequate PCB-to-ground paths for peripheral cards. One example is a compression spring that is constrained in a pocket of the package frame for extendable portions of the peripheral card such as for an XJACK®, manufactured by the assignee of the present invention. The compression spring, however, does not provide adequate surface area to insure reliable contact. Additionally, the compression spring must be fitted onto the frame pocket by hand, it is small, and because it is a discreet piece, it may be easily lost.

Another example is a clip that is soldered to one side of the peripheral card's PCB. The soldered clip has the problem that it requires hand-soldering and handling and that a multiple number of clips may be required to accomplish a cover-to-cover contact for the peripheral card.

Another article that has been used to deal with both EMI and ESD is a clip that is crimped to the plastic frame of a peripheral card such as a PCMCIA card and that makes electrical contact with both the upper metallic sheet and the lower metallic sheet. Additionally, a portion of the clip has a tab that extends therefrom and makes electrical contact with an electrically conductive pad on the PCB. The crimped clip, because of its extremely thin nature, can become damaged due to conventional handling during assembly. Additionally, the tab, because it extends beyond the frame, may require intensive labor to install and to crimp. Additionally, the clip cannot be reworked and the tab may not make adequate contact with the pad on the PCB. Additionally, there are multiple steps of manufacture and assembly which are wasted if a subsequent process causes damage.

Another device that has been used to manage EMI and ESD is a formed tab that is integral to the metallic shield. As with the clip on the PCB and tab in the crimped clip, the formed tab can be easily damaged during assembly and may not make adequate contact with the PCB. It is also flimsy and potentially unreliable because its resilience may be damaged.

Another article that has been used for EMI and ESD management is a gasket material that is compressed between one of the metallic shields and the PCB. The gasket material, however, may not remain intact or in its proper orientation. As such, it may cause irreparable damage to electronic components contained in the peripheral card and it requires a great deal of handling to assemble.

As with all of these prior art attempts for EMI and ESD protection, where proper contact is not made, the peripheral card can act as an antenna and/or create unwanted electromagnetic emissions. Additionally, if a metal shielded connector with contact tabs is used as part of the peripheral card, and the contact tabs do not make proper contact, the peripheral card can become an antenna.

Another configuration that is made to deal with both EMI and ESD is the placement of a ground trace around the outer perimeter of a PCMCIA card, the overmolding of the PCB with first a dielectric material, and second a conductive material, and the placement of a conductive adhesive and a metallic sheet upon the adhesive material. The packaging of a PCMCIA card after this fashion allows for the dissipation of both EMI and ESD. This configuration has several drawbacks including a substantially permanent sealing off of the PCB surface, the overmolding's blanket effect that prevents cooling of the PCB components, poor electrical conductivity through the electrically conductive adhesive and a very large portion of the card's surface area being taken up by the ground trace.

As the miniaturization increases for peripheral devices, the "real estate" comprising the available surface on both sides of the PCB becomes more valuable, and structures that deal with both EMI and ESD take up needed room on the PCB surface.

What is needed in the art is a structure for a peripheral device that adequately addresses both EMI and ESD without taking up valuable real estate on the PCB has been done in the prior art.

Such structures, assemblies, methods of forming, and apparatuses are disclosed and claimed herein.

SUMMARY AND OBJECTS OF THE INVENTION

The present invention relates to an electrical contact block for use in an electronic peripheral card such as a PCMCIA card. The electrical contact block is an article of manufacture that includes a dielectric body that at least partially encloses a metal contact. The metal contact is configured to have at least one contact that extends beyond the dielectric body and that touches a path to ground such as the metallic covering sheet of a PCMCIA card. Additionally, the metal contact is configured to have at least one folded section that is surface mounted to a printed circuit board to complete the path to ground for the printed circuit board. The electrical contact block is preferably mounted in a depression in the printed circuit board that may either be a through channel for a double-grounded configuration or a well for a single-grounded configuration. The electrical contact block may be reflow soldered at the surface mounted folded section for increased adherence to the printed circuit board. The dielectric body may be configured to allow for pick and place technology to be used for mounting upon the printed circuit board.

It is an object of the present invention to provide a path to ground for an electronic peripheral card that overcomes the problems of the prior art. It is therefore an object of the present invention to provide an electrical contact block that is surface mounted. It is also an object of the present invention to provide an electrical contact block that is conducive to pick and place technology. It is also an object of the present invention to provide an electrical contact block that takes up a smaller space than that of the prior art, thereby facilitating miniaturization.

It is also an object of the present invention to provide a method of making an electronic peripheral card that uses the inventive electrical contact block.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of embodiments of the present invention and are not necessarily drawn to scale.

Figure 1:
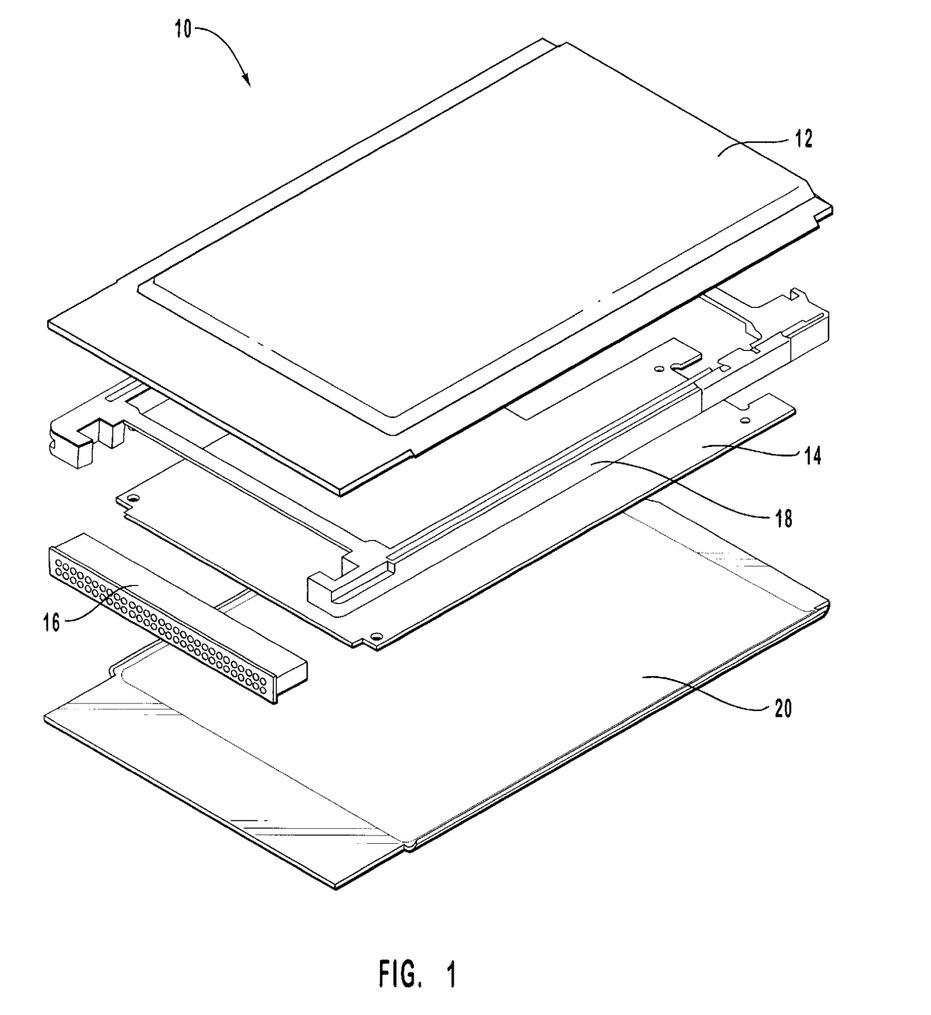
FIG. 1 is an exploded perspective view of selected components of a PCMCIA card.

FIG. 1 is an exploded elevational view of typical components in a prior art peripheral card such as a PCMCIA card. As can be seen, a PCMCIA assembly 10 includes an upper metallic sheet 12, a printed circuit board (PCB) 14, a connector such as a multiple-socket connector 16, that attaches to one end of PCB 14, a frame 18 that assists in the packaging of PCMCIA assembly 10, and a lower metallic sheet 20.

Figure 2:
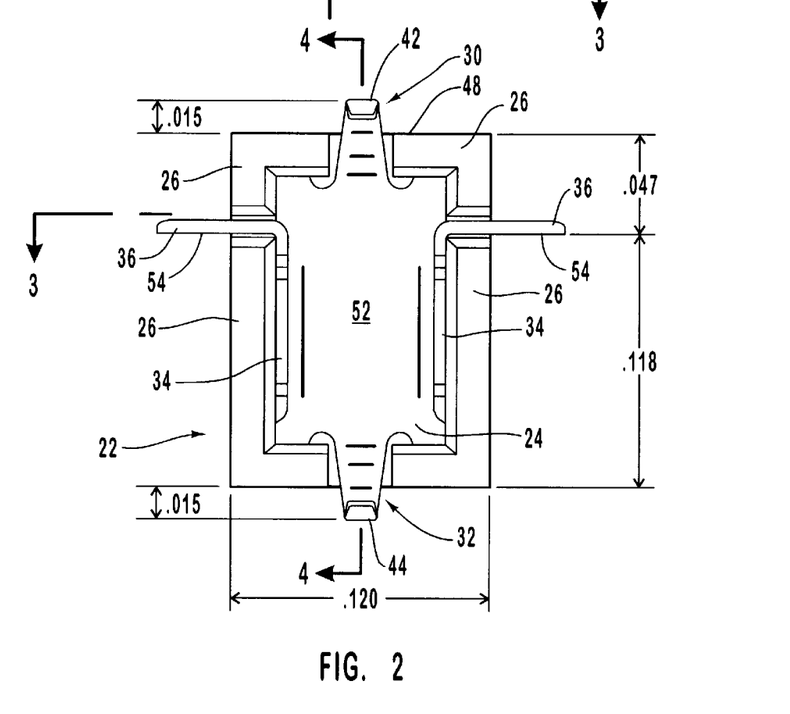
FIG. 2 is an elevational front view of the inventive surface mounted cover-to-cover contact block.

FIG. 2 is an elevational front view of a cover-to-cover (CTC) contact block 22. The dimensions illustrated are in arbitrary units but may be read in mils. CTC contact block 22 has two major components. A first component is a metal contact 24. A dielectric body 26 is the second component. Metal connect 24 is inserted into dielectric body 26. Metal contact 24 is preferably a unitary article that is stamped or formed by powder metallurgy.

Metal contact 24 can be made by stamping or by the sintering of preferred metal powders, followed by stamping or folding. Metal contact 24 includes an upper contact 30 and a lower contact 32. Upper contact 30 terminates into a major section 52 of metal contact 24. Likewise, lower contact 32 terminates into major section 52 of metal contact 24. Major section 52 is substantially planar in shape. Upper contact 30 and lower contact 32 are configured so as to respectively make electrical contact with upper metallic sheet 12 and lower metallic sheet 20 as illustrated in FIG. 1. It can be seen that as part of upper contact 30 an upper arcuate contact point 42 is formed near the terminal end thereof. Upper arcuate contact point 42 has its counterpart in lower contact 32 as a lower arcuate contact point 44.

Metal contact 24, as formed is a three-dimensional structure for insertion within a dielectric body cavity 46 of dielectric body 26. Metal contact 24 includes major section 52 in addition to upper contact 30 and lower contact 32. Additionally, a first folded section 34 of metal contact 24 is illustrated as terminating into major section 52 of metal contact 24 and bending away from major section 52 out of the plane of the figure.

A means for surface mounting upon PCB 14 is provided. It may include a portion of first folded section 34 of metal contact 24. It includes a second folded section 36 of metal contact 24 that may terminate into first folded section 34. Second folded section 36 of metal contact 24 runs substantially orthogonal to the plane of the figure as well as substantially orthogonal to first folded section 34. Second folded section 36 of metal contact 24 is configured to make a surface-mounted contact with a printed circuit board upon a lower surface 54 of second folded section 36. It can also be seen that two occurrences of second folded section 36 of metal contact 24 extend laterally beyond the perimeter of dielectric body 26 to facilitate surface mounting thereof at lower surface 54 of second folded section 36.

Figure 3:
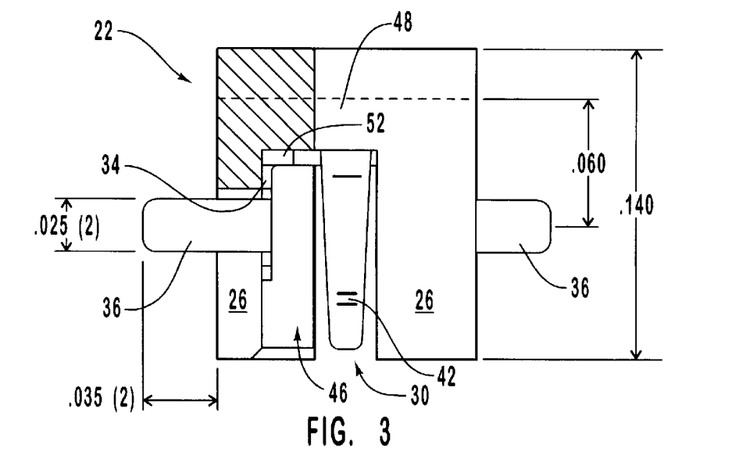
FIG. 3 is a top perspective view of the inventive surface mount cover-to-cover contact block with a cut-away portion that exposes a wing or folded section of the metal contact.

FIG. 3 is a top view of CTC contact block 22, wherein a portion of the left upper region of dielectric body 26 has been cut away to reveal one occurrence of second folded section 36 of metal contact 24. It can be seen that upper contact 30 extends away from major section 52 of metal contact 24 and that the two occurrences of second folded section 36 extend laterally beyond dielectric body 26.

Figure 4:
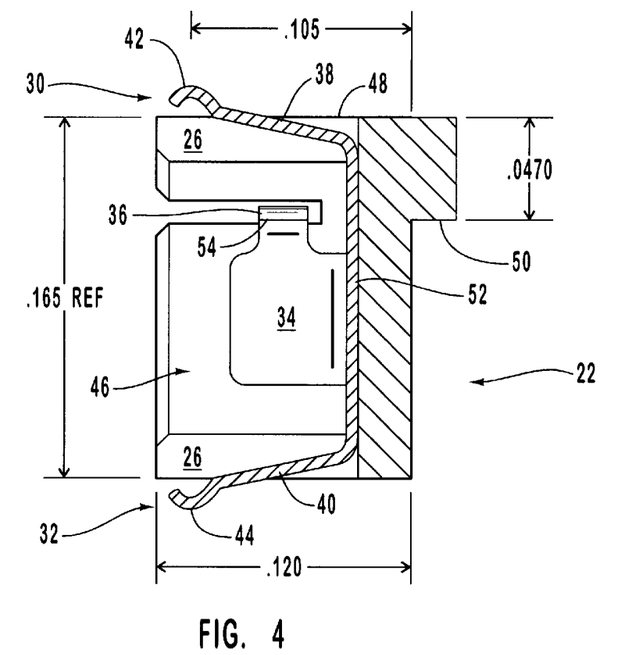
FIG. 4 is an elevational side view of the inventive contact block in which a cut17 away of the body exposes a lateral portion of the metal contact.

FIG. 4 is an elevational side view of CTC contact block 22 depicted in FIG. 2, wherein substantially the entire right half of dielectric body 26, as illustrated in FIG. 2, has been cut away to reveal one of first folded section 34 of metal contact 24. In FIG. 4, second folded section 36 of metal contact 24 is illustrated as extending perpendicularly out of the plane of the figure as well as substantially perpendicular to first folded section 34. It can be seen that lower surface 54 of second folded section 36 of metal contact 24 is located at substantially the same elevation as a cantilever 50 that is part of dielectric body 26. In FIG. 4, it can be seen that an upper folded section 38 and a lower folded section 40 of metal contact 24 respectively extend above and below the upper and lower boundaries of dielectric body 26 so as to form angles that are obtuse to the plane of major section 58. Upper folded section 38 and lower folded section 40 are therefore able to make contact at upper arcuate contact point 42 and lower arcuate contact point 44, respectively, with metallic portions such as upper metallic sheet 12 and lower metallic sheet 20 of PCMCIA assembly 10.

Figure 5:
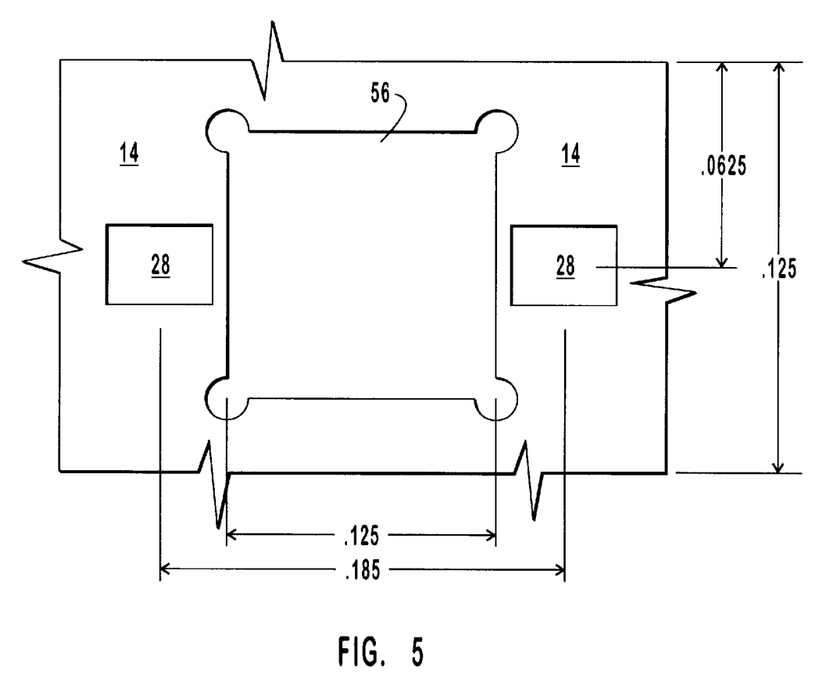
FIG. 5 is a plan view of a section of a PCB with a depression and solder pads that are configured to receive and connect the inventive contact block.

FIG. 5 illustrates a portion of PCB 14 that is configured to receive an inventive contact block. It can be seen that a depression is formed in PCB 14. In this embodiment, the depression is a through-channel 56 that has been formed in PCB 14. Through-channel 56 is configured to have substantially the same footprint of dielectric body 26 as seen from the top-down view thereof as depicted in FIG. 3. Additionally, at least one conductive landing pad 28 is disposed upon PCB 14 adjacent to through-channel 56. Conductive landing pad 28 is part of the means for surface mounting upon PCB 14. Preferably, two occurrences of conductive landing pad 28 are disposed upon PCB 14 and located so as to allow lower surface 54 of second folded section 36 of metal contact 24 to come to rest in electrical communication with conductive landing pad 28. Cantilever 50 is optional but preferred as it, in conjunction with two occurrences of second folded section 36, forms the third leg of a tripod configuration that stabilizes CTC contact block 22 within through-channel 56.

The material that makes up metal contact 24 will have a combination of useful electrical conductivity and tensile and flexural resiliency so as to allow upper contact 30 and lower contact 32 to both electrically conduct and to flex during the lifetime of the peripheral card without causing a field failure. Additionally, the material that makes up metal contact 24 will have preferably conductivity qualities that allow for a low ohmic resistivity and that allow compatibility with a reflow soldering process. The electrical conductivity of metal contact 24 may be of any degree that is sufficient for a given application. The electrical conductivity will be greater than about $1 \times 10^5$ ohm$^{-1}$ meter$^{-1}$. Preferably, the electrical conductivity will be greater than about $0.1 \times 10^7$ ohms$^{-1}$ meter$^{-1}$. More preferably, the electrical conductivity will be greater than about $3.5 \times 10^7$ ohm$^{-1}$ meter$^{-1}$. Most preferably, the electrical conductivity will be greater than about $5.5 \times 10^7$ ohm$^{-1}$ meter$^{-1}$.

The combination of the inventive contact block and the metallic sheets will have an ohm rating of about 3 ohms, preferably about 2 ohms, more preferably about 1 ohm, and most preferably between about 0.1 ohms and less than about 1 ohm for some devices. For fast Ethernet devices, for example where there are high speed data being transferred, it is preferred to have the resistance values extremely low, in the range between about 0.1 ohms and less than about 1 ohm, because it enhances the EMI capabilities.

Figure 6:
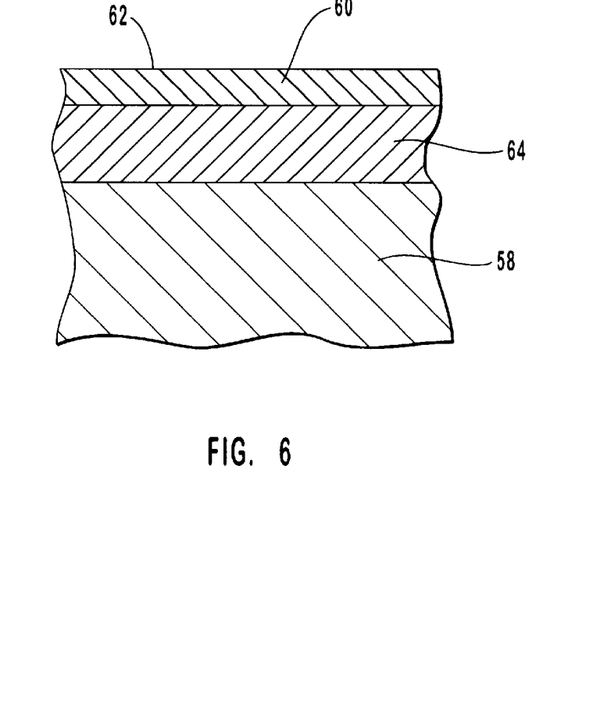
FIG. 6 is an elevational cross-section view of part of a metal contact, wherein its composite structure is illustrated.

One preferred embodiment of the present invention is illustrated in FIG. 6 wherein it can be seen that a laminate structure is depicted in cross section. FIG. 6 is a cross-sectional depiction of any portion of metal contact 24, taken from an external surface 62 thereof to substantially near the center 58 thereof. In a preferred embodiment, center 58 of metal contact 24 is made of a beryllium-copper alloy with an alloying ratio of at least about Be-30Cu. Preferably, the alloying ratio is about Be-50 Cu. More preferably, the alloying ratio is greater than about Be-70Cu. Most preferably, the alloying ratio is greater than about Be-90Cu.

A gold skin 60 makes up the external surface 62 of metal contact 24. Gold skin 60 may be doré. The alloying ratio may be greater than about Ag-90Au. Preferably, the alloying ratio may be greater than about Ag-95Au. Most preferably, the alloying ratio may be greater than about Ag-99Au. Gold skin 60 may be in a thickness range from about 0.1 to about 10 microns, preferably from about 0.5 to about 5 microns, and more preferably from about 1 to about 3 microns.

Because gold and copper tend to have an affinity for each other that would cause gold skin 60 to absorb into center 58, and because it is preferred that gold skin 60 remains substantially at external surface 62, a liner layer 64 may be placed between gold skin 60 and center 58 of metal contact 24. A preferred composition for liner layer 64 is a nickel-palladium palladium alloy that may be in an alloying ratio of about Ni-60 Pd, more preferably about Ni-70 Pd, and most preferably in an alloying ratio about of Ni-80 Pd. With a nickel-palladium alloy, gold skin 60 adheres well thereto.

Dielectric body 26 can be made of any material that is approved by Underwriters Laboratories for application in a peripheral card such as a PCMCIA card. Dielectric body 26 may be made out of any plastic material that is useful in electronic devices. One such material is nylon. As such, the material making up dielectric body 26 may have the qualities to comply with UL® safety standards. For example, the tip and ring characteristics of voltage in a telephone line requires the telephone jack material to have the same qualities that exist in a 110 volt line cord and its connectors. As such, the material of dielectric body 26 may be a primary electrical support that abides by certain flammability requirements and resists arcing in spite of the electrical ring voltage.

Although many telephone jack-type materials are available for use as dielectric body 26, few of them in the prior art are transparent. In the present invention, a transparent material is most preferred as metal contact 24 is of such a diminutive dimension that visual inspection may be useful. Preferred transparent materials made be those such as made under the trademark ULTEM® which is a polyetherimide, made by GE Plastics of Pittsfield, Mass. Dielectric body 26 preferably also has certain strength qualities in order to not fracture during the insertion of metal contact 24 into dielectric body cavity 46 and during 20 field use of the interconnect device. Such qualities may require the addition of fibers and 21 other strengthening additives to the material of dielectric body 26 such as glass or carbon fibers. The preferred fibers have an aspect ratio (length:width) in a range from about 2:1 to 10:1, preferably from about 4:1 to about 8:1, and more preferably about 6:1.

Another preferred material for dielectric body 26 is LEXAN 940® which is a polycarbonate with a UL®-approved flammability rating. Flammability ratings that are preferred in the present invention for dielectric body 26 include V0, V1, V2, V3, V4, V5, and 94-V0. Another flammability rating that is preferred is a horizontal burn (HB) rating. Other materials that are suitable include LEXAN 940A®, LEXAN 920®, and LEXAN 920A®. Another material that may be useful for formation of dielectric body 26 is polysulphone. Another material that may be useful for the formation of dielectric body 26 is polyester. Another material that may be useful for the formation of dielectric body 26 is polyvinyl chloride (PVC). Another material that may be useful for the formation of dielectric body 26 is styrene acrylonitrile (SAN). Another material that may be useful for the formation of dielectric body 26 is silicate glass.

Dielectric body 26 preferably is able to withstand routine temperatures experienced during ordinary reflow of a metallic paste that may be part of the means for surface-mounted soldering of second folded section 36 of metal contact 24 onto conductive landing pad 28 of PCB 14.

Figure 7:
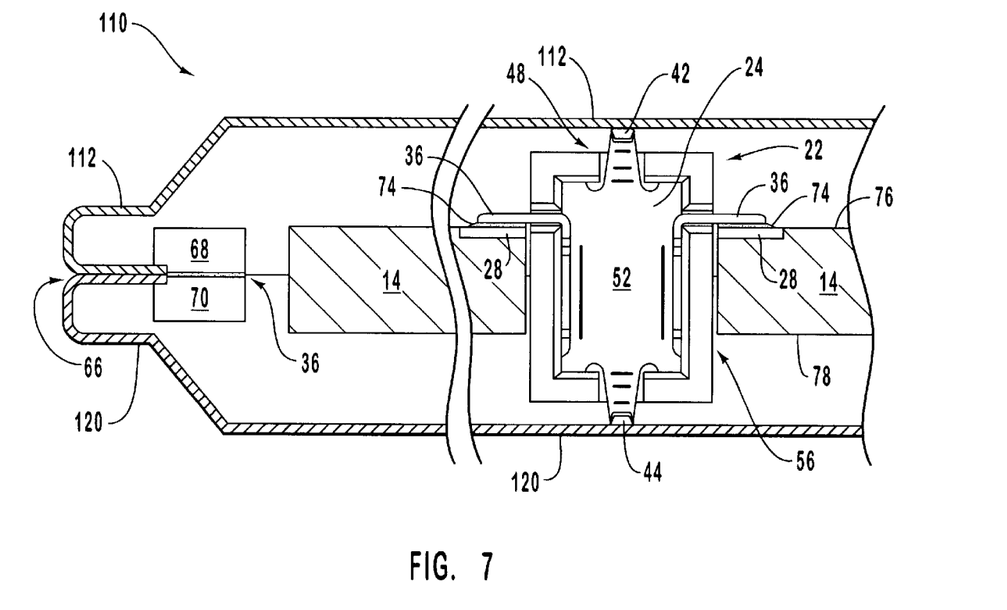
FIG. 7 is an elevational cut-away view of an electronic peripheral card, wherein an inventive surface mount cover-to-cover contact block is embedded in a printed circuit board to provide a path to ground to both covers of the peripheral card.

FIG. 7 illustrates one application of CTC contact block 22 as a system for EMI/ESD control in connection with PCB 14 having an upper surface 76 and a lower surface 78 as part of PCMCIA assembly 110. It can be seen that an upper metallic sheet 112 and a lower metallic sheet 120 are formed so as to have an abutting surfaces region 66 such that electrical contact is made therebetween. A first plastic block 68 and a second plastic block 70 are formed to assure the creation of abutting surfaces region 66. First plastic block 68 and a second plastic block 70 may be fused by an ultrasonically welded seam 72. CTC contact block 22 is illustrated as being inserted into the depression that is through-channel 56 of PCB 14. It can be seen that a reflow solder paste 74 makes a permanent electrical connection between conductive landing pad 28 and second folded section 36 of metal contact 24. Reflow solder paste 74 may be part of the means for surface mounting upon PCB 14. It can be seen that upper arcuate contact point 42 touches upper metallic sheet 112 and that lower arcuate contact point 44 touches lower metallic sheet 120.

Figure 8:
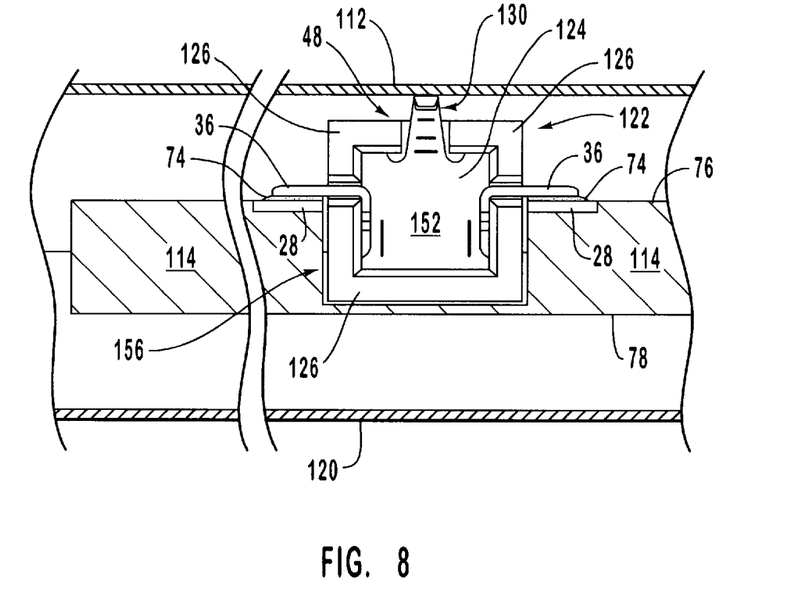
FIG. 8 is an alternative embodiment of the inventive surface-mount contact block, wherein the path to ground is in only one direction.

FIG. 8 is an illustration of another embodiment of the present invention wherein it can be seen that a contact block 122 is made up of a metal contact 124 and a dielectric body 126. The major section 152 of metal contact 124 only has an upper contact 130 that terminates thereinto. Contact block 122 may sit in a depression such as a well 156 within a PCB 114. Because upper metallic sheet 112 and lower metallic sheet 120 form abutting surfaces region 66, substantial electrical contact therebetween is made and contact block 122 only requires one occurrence of a contact; upper contact 130 is therefore provided. One advantage of the structure depicted in FIG. 8 is that even less real estate is required upon PCB 114 such that circuitry and/or components may occupy lower surface 78 of PCB 114 immediately beneath the placement of contact block 122.

Figure 9:
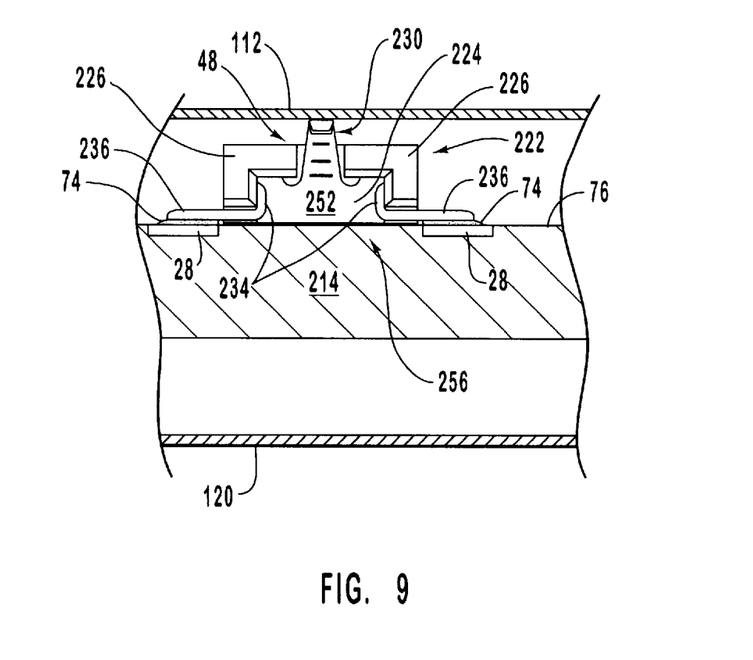
FIG. 9 is an elevational front view of an alternative embodiment of the present invention in which the inventive structure is entirely surface mounted.

FIG. 9 is an elevational front view of an alternative embodiment of the present invention in which the inventive structure is entirely surface mounted. It can be seen that a metal contact 224 has been pressed into a dielectric body 226 and that a first folded section 234 terminates into a major section 252 of metal contact 224. Additionally, a second folded section 236, two occurrences, fold outwardly and make contact with conductive landing pad 28. It is notable that the location site 256 has no depression such as through channel 56 or well 156. Additionally, the two occurrences of first folded section 234 may be spring loaded in order to hold metal contact 224 into the dielectric body cavity 246 without metal contact 224 falling out.

It becomes clear that metal contacts 124 and 224 may be configured with their respective second folded sections 136 an 236, folded inwardly toward the respective centroids of major section 152, 252. With this alternative embodiment, the contact block is located above a single conductive landing pad that would be located either within well 156 or upon location site 256.

CTC contact block 22, contact block 122, or contact block 222 may be located virtually anywhere upon a selected printed circuit board. This may include the formation of through-channel 56 or well 156 anywhere at the edge of a printed circuit board or in the middle thereof. Preferably, the contact block will be located near the DAA circuitry if present upon the printed circuit board, which is where most of the EMI problems occur.

The installation of a contact block within a printed circuit board according to the present invention uses surface mount technology to make electrical connection between the contact block and the printed circuit board. In FIGS. 7–9, it can be seen that second folded section 36 of metal contact 24 is disposed upon reflow solder paste 74 that in turn is disposed upon conductive landing pad 28. In effect, CTC contact block 22 is surface mounted upon upper surface 76 of PCB 14. As seen in FIG. 4 and as may be applied to FIGS. 2–4 and 7–9, cantilever 50 and lower surface 54 of second folded section 36 are configured at the same elevation so as to respectively rest upon upper surface 76 of PCB 14 and upon conductive landing pad 28. Although the use of reflow solder paste 74 is optional, its use is also preferred. CTC contact block 22 made be sized so as to fit substantially snugly into through-channel 56 such that the use of reflow solder paste 74 is not necessary. Alternatively, second folded section 36 of metal contact 24 may be configured with greater than a right angle arcuate fold such that it contacts conductive landing pad 28 under a flexural load when cantilever is abutting against upper surface 76 of PCB 14. Thus, second folded section 36 of metal contact 24 may be configured with greater than a right angle fold and therefore, may be part of the means for surface mounting upon PCB 14.

CTC contact block 22 may be mounted into PCB 14 by "pick and place" technology by picking CTC contact 22 from a tape or the like and placing it into through channel 56. A suction contact area 48, as seen in FIGS. 2–4 and 7–9, is located on dielectric body 26. Pick and place technology is used to pick CTC contact block 22 or contact block 122 from a tape and the like and to place it into a depression upon the printed circuit board such as into through channel 56 or into well 156.

The securing of CTC contact block 22, contact block 122, or contact block 222 is preferably done by reflow of solder paste 74. The solder paste and the materials making up conductive landing pad 28 are preferably selected in connection with gold skin 60 so as to minimize thermal creep stresses that arise due to disparate coefficients of thermal expansion between the three materials making up metal contact 24, solder paste 74, and conductive landing pad 28. For example, silver may be alloyed with gold for gold skin 60 to achieve a thermal expansion coefficient that is approximately that of copper. The same may be done with solder paste 74 and with Ni—Be alloys that may be used as liner layer 64. The material that makes up conductive landing pad 28 may also be selected accordingly. In one embodiment, the coefficient of thermal expansion has a nominal value for conductive landing pad 28, has a slightly increased or decreased coefficient of thermal expansion for the solder paste, and has a slightly increased or decreased (over the solder paste) coefficient of thermal expansion for metal contact 24. In other words, an increasing or decreasing gradient is present describing the coefficients of thermal expansion across the three structures. The gradient may be linear or nonlinear. Preferably it is a substantially linear gradient and has a coefficient of thermal expansion variance between conductive landing pad 28 and metal contact 24 of about 10%, preferably less than about 5% and more preferably less than about 2%. In each case, solder paste 74 coefficient of thermal expansion has a value that is preferably between those of conductive landing pad 28 and metal contact 24.

As applied to contact blocks 122 and 222, the same alternative embodiments are 21 contemplated, including the optional use of reflow solder paste 74 and the optional flexural contact of second folded sections 36 and 236 onto conductive landing pad 28.

Contact blocks in accordance with the present invention provide superior ground contact by providing a ground path to the upper and/or metallic sheets in order to consistently and advantageously achieve protection for the peripheral card against EMI and ESD. Furthermore, the inventive contact blocks provide a high ground-to-signal ratio for the peripheral device, thereby insuring good data communication therethrough at all times during its use. The contact blocks are versatile and can be used in any situation where a ground contact must be made, and are adaptable for use in printed circuit boards contained within peripheral devices and within other devices having printed circuit boards of varying dimensions.

One distinct advantage of the present invention is that the inventive contact blocks are easy to install compared to the prior art, lend themselves well to pick and place automation, and are therefore less expensive to manufacture. Additionally, the inventive contact blocks are less likely to come loose and to become lost or to short out other components on the PCB.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An EMI/ESD dissipation ysstem comprising:
    a peripheral card having an upper metallic sheet and a lower metallic sheet; a printed circuit board
    at least partially disposed between the upper and the lower sheets;
    a dielectric body disposed upon said printed circuit board; and
    a metal contact disposed in said dielectric body, wherein said metal contact has at least one means for surface mounting upon said printed circuit board, and at least one contact portion that extends through the dielectric body and makes electrical contact with and directly engages at least one of said upper metallic sheet and said lower metallic sheet and thereby form an electrical connection to a ground path.

2. An EMI/ESD dissipation system according to claim 1, wherein said printed circuit board has a depression therein, and wherein said dielectric body is fixed in said depression.

3. An EMI/ESD dissipation system according to claim 2, wherein said depression in said printed circuit board is a through channel.

4. An EMI/ESD dissipation system according to claim 1, wherein said peripheral card is configured to have an abutting surface region between said upper metallic sheet and said lower metallic sheet.

5. An EMI/ESD dissipation system according to claim 1, wherein said dielectric body has at least one of a UL®-approved flammability rating selected from V0, V1, V2, V3, V4, V5, 94-V0, and HB.

6. An EMI/ESD dissipation system according to claim 1, wherein said at least one means for surface mounting upon said printed circuit board includes a conductive landing pad upon said printed circuit board, solder paste disposed upon said conductive landing pad, and at least a portion of said metal contact disposed upon said solder paste, wherein an increasing or decreasing gradient exists describing the coefficients of thermal expansion of said conductive landing pad, said solder paste, and said metal contact, and wherein the variance between the coefficient of thermal expansion of said conductive landing pad and said metal contact is less than about 10%.

7. An EMI/ESD dissipation system according to claim 6, wherein the value of the coefficient of thermal expansion for said solder paste is between that of said conductive landing pad and said metal contact.

8. A method of making an EMI/ESD dissipation system comprising:
    in a peripheral card having an upper metallic sheet and a lower metallic sheet, providing a printed circuit board having a depression therein;
    positioning a metal contact within a dielectric body;
    inserting said dielectric body into said depression and surface mounting a portion of the metal contact to the printed circuit board; and directly engaging at least a portion of the metal contact with at least one of said upper metallic sheet and said lower metallic sheet so as to thereby form an electrical connection to a ground path.

9. A method of making a an EMI/ESD dissipation system according to claim 8, wherein surface mounting said dielectric body includes:

providing a solder paste composition;

contacting said solder paste composition with said printed circuit board and said portion of the metal contact; and reflowing said solder paste composition.

10. A method of making a an EMI/ESD dissipation system according to claim 8, wherein inserting said dielectric body into said depression is carried out by pick and place technology.

* * * * *

UNITED STATES PATENT AND TRADEMARK OFFICE
CERTIFICATE OF CORRECTION

PATENT NO. : 6,071,130
DATED : June 6, 2000
INVENTOR(S) : Thomas A. Johnson

It is certified that error appears in the above-identified patent and that said Letters Patent is hereby corrected as shown below:

Col. 1, ln. 33: before "functioning" change "there" to --their--

Col. 2, ln. 9: after "Several" change "arrangement" to --arrangements--

Col. 4, ln. 16: before "of the body" change "cut17 away" to --cut-away--

Col. 4, ln. 57: after "Metal" change "connect" to --contact--

Col. 6, ln. 22: before "meter$^{-1}$" change "ohms$^{-1}$" to --ohm$^{-1}$--

Col. 6, ln. 61: before "alloy" delete --palladium--

Col. 6, ln. 63: after "ratio" change "about of" to --of about--

Col. 7, ln. 22: before "field" delete --20--

Col. 7, ln. 24: before "other strengthening" delete --21--

Col. 9, ln. 46: before "contemplated" delete --21--

Col. 10, ln. 13: after "dissipation" change "ysstem" to --system--

Col. 11, ln. 5: after "making" delete --a--

Col. 12, ln. 4: after "making" delete --a-

Signed and Sealed this

Twenty-second Day of May, 2001

Attest:

NICHOLAS P. GODICI

Attesting Officer

Acting Director of the United States Patent and Trademark Office